United States Patent [19] [11] Patent Number: 4,836,733
Hertel et al. [45] Date of Patent: Jun. 6, 1989

[54] WAFER TRANSFER SYSTEM

[75] Inventors: Richard J. Hertel, Bradford; Adrian C. Delforge; Eric L. Mears, both of Rockport; Edward D. MacIntosh, Gloucester; Robert E. Jennings, Methuen; Akhil Bhargava, Reading; William H. Bartula, Manchester, all of Mass.

[73] Assignee: Varian Associates, Inc., Palo Alto, Calif.

[21] Appl. No.: 135,568

[22] Filed: Dec. 21, 1987

Related U.S. Application Data

[63] Continuation of Ser. No. 856,814, Apr. 28, 1986, abandoned.

[51] Int. Cl.[4] .............................................. B65H 5/08
[52] U.S. Cl. .................................... 414/225; 29/720; 414/416; 414/331; 198/341; 198/464.2
[58] Field of Search .............. 414/222, 225, 217, 331, 414/416, 417, 786; 29/703, 705, 712, 714, 720; 198/341, 464.1, 464.2; 294/102

[56] References Cited

U.S. PATENT DOCUMENTS

| | | | |
|---|---|---|---|
| 2,326,962 | 8/1943 | Meier | 294/902 X |
| 3,010,587 | 11/1961 | Hollinger | 214/1 |
| 3,363,474 | 1/1968 | Ritter et al. | 74/52 |
| 3,401,568 | 9/1968 | Blatt | 74/37 |
| 3,561,614 | 2/1971 | Tezuka | 214/1 |
| 3,823,836 | 7/1974 | Cheney et al. | 414/331 X |
| 3,901,183 | 8/1975 | Wittkower | 118/49.1 |
| 4,024,944 | 5/1977 | Adams et al. | 198/394 |
| 4,165,132 | 8/1979 | Hassan et al. | 406/10 |
| 4,299,533 | 11/1981 | Ohnaka | 414/737 X |
| 4,311,427 | 1/1982 | Coad et al. | 414/217 |
| 4,392,776 | 7/1983 | Shum | 414/744 R |
| 4,433,951 | 2/1984 | Koch et al. | 414/217 |
| 4,457,664 | 7/1984 | Judell et al. | 414/779 |
| 4,475,122 | 10/1984 | Green | 358/101 |
| 4,501,527 | 2/1985 | Jacoby et al. | 414/225 |
| 4,548,236 | 10/1985 | Bloomquist | 137/615 |
| 4,553,069 | 11/1985 | Purser | 414/225 X |
| 4,584,045 | 4/1986 | Richards | 156/345 |
| 4,600,355 | 7/1986 | Johnson | 414/680 |
| 4,619,575 | 10/1986 | Summa et al. | 414/280 |
| 4,621,331 | 11/1986 | Iwata | 901/33 X |
| 4,643,627 | 2/1987 | Bednorz et al. | 414/217 |
| 4,657,475 | 4/1987 | Ohtsuji et al. | 414/786 |

FOREIGN PATENT DOCUMENTS

| | | |
|---|---|---|
| 0160305 | 5/1985 | European Pat. Off. . |
| 0154342 | 11/1980 | German Democratic Rep. . |
| 595224 | 3/1978 | U.S.S.R. . |
| 1206077 | 9/1983 | U.S.S.R. . |

OTHER PUBLICATIONS

IBM Technical Disclosure Bulletin, vol. 18, No. 11, Apr. 1976.

Primary Examiner—Robert J. Spar
Assistant Examiner—Donald W. Underwood
Attorney, Agent, or Firm—Stanley Z. Cole; Terrence E. Dooher

[57] ABSTRACT

Wafer transfer apparatus for horizontal transfer of a wafer between a cassette and an input station of a vacuum processing system includes a wafer transfer arm with a primary section linked to a secondary section so as to move a wafer in a straight line to a location and orientation station and then to the input station. The actual location of the wafer center and the angular orientation of the wafer flat are determined, and the wafer is rotated to a desired angular orientation at the location and orientation station. A solar cell is used to sense actual wafer position by sensing the wafer edge as it is rotated. The required correction and rotation are calculated from the solar cell output. As the wafer is transferred to the input station, correcting displacements are added to the movement so that the wafer is accurately positioned at the input station. A strain gauge is used to reliably sense wafer presence or absence on the transfer arm.

38 Claims, 8 Drawing Sheets

WAFER TRANSFER SYSTEM

This application is a continuation of application Ser. No. 06/856,814, filed 4/28/86, now abandoned.

FIELD OF THE INVENTION

This invention relates to apparatus for transferring a semiconductor wafer to and between a cassette holder and an input station of a vacuum processing system and, more particularly, to wafer transfer apparatus utilizing a robot-like arm and having the capability to determine and eliminate wafer positioning errors.

BACKGROUND OF THE INVENTION

In the fabrication of microminiature integrated circuits on semiconductor wafers, it has become standard practice to store and to move wafers in a cassette wafer holder. A number of wafers are carried in closely-spaced parallel slots in a cassette holder. In the processing of the wafers, it is usually necessary to unload the wafers from the cassette holder, one at a time, and to transfer them to an input station of a vacuum processing system. Examples are processing equipment for ion implantation, sputter etching, plasma etching, chemical vapor deposition, lithography and the like. Wafers are transferred through an isolation lock into the main vacuum processing chamber to avoid the necessity for vacuum pumping the entire chamber each time a new wafer is introduced or removed. After processing is completed, the wafer is transferred back to the cassette holder for removal and further processing. Some wafer processing systems treat only one wafer at a time, while others treat a plurality of wafers in a batch. In batch systems, wafers are similarly transferred one at a time from a cassette to the input station of the system.

In recent years there has been a trend toward automation of wafer handling systems in order to speed up the transfer process, to avoid human error and to reduce particulates and contamination associated with manual handling. Automated wafer handling systems are subject to a variety of requirements and limitations. The avoidance of particulate contamination is of extreme importance, since even micron-size particles can degrade or destroy devices on the wafer. To prevent contamination, it is necessary to avoid abrasion and chipping of the wafer edge. Any edge contact must be extremely gentle. Furthermore, moving parts of mechanisms used near wafers must be very carefully designed to control particulates. Moving parts are preferably located below the wafers and shielded to the extent possible. Also, air flow must circulate particles away from the wafer.

Other considerations in the design of wafer handling systems include a requirement for high speed, since the time for loading and unloading wafers adds to the total process time and to wafer cost. Since speed is important, the means for transferring wafers from atmosphere to vacuum is a critical factor. Some prior art systems load one wafer at a time through a vacuum lock while others load an entire cassette, holding up to twenty-five wafers, in a vacuum lock. Additional requirements include the replacement of a wafer into the same cassette slot from which it was removed. This requirement necessitates wafer-carrying devices which can remove a particular wafer from a cassette without contacting or damaging adjacent wafers spaced only one tenth of an inch apart.

A further requirement is to accurately position the wafer on the input station with its flat having a predetermined orientation. The slots in the cassette holder are somewhat larger than the wafer and, thus, do not insure accurate wafer positioning. Further, the wafer flat orientation is not controlled in the cassette holder. However, accurate positioning in the input station of the processing system is necessary to insure reliable wafer retention and to avoid wafer damage. Ion implantation systems require a particular wafer flat orientation, which is indicative of the crystal orientation of the wafer, to control channeling by impinging ions.

In prior art systems, a wafer position sensor has determined the actual position of a wafer relative to a desired position, and used separate means for translating the wafer to the desired position, and then moved the wafer to the input station. The prior art systems are disadvantageous in that additional hardware is required for moving the wafer to its desired position. In addition, further position error can be introduced as the wafer is transferred from the orientor station to the input station.

A variety of wafer handling techniques have been used in the prior art. Vacuum chucks have been used to grip the rear of a wafer when the system operates in atmosphere. A curved and grooved lift blade has been used to vertically and edgewise lift wafers from a cassette to a processing station. Moving belts and air cushions have also been employed. All of the prior art systems have suffered from certain disadvantages and limitations such as generation of particulate contamination, abrasion or damage to wafers and inadequate speed.

It is a general object of the present invention to provide a new and improved apparatus for transferring wafers from a cassette holder to an input station of a processing system.

It is a further object of the present invention to provide apparatus utilizing a robot-like arm for transferring wafers to and between a cassette holder and an input station of a processing system.

It is a further object of the present invention to provide apparatus and methods for transferring a wafer to an input station of a processing system with compensation for undesired wafer displacement.

It is a further object of the present invention to provide apparatus and methods for transferring a wafer to an input station of a processing system with a desired angular orientation.

It is a further object of the present invention to provide a wafer support pick for transfer of wafers provided with a means for sensing the weight of a wafer on the pick.

It is a further object of the present invention to provide apparatus and method for presenting a wafer to a wafer identification visual inspection station for enhanced process control.

It is a further object of the present invention to provide apparatus for accurately transferring wafers to and between at least one cassette holder and an input station of a processing system in vacuum.

SUMMARY OF THE INVENTION

According to the present invention, these and other objects and advantages are achieved in apparatus for transferring a wafer from a cassette holder to an input station of a processing system. The apparatus comprises a wafer transfer arm for transferring a wafer in a plane between the cassette holder and the input station, means for holding the cassette holder with wafers parallel to the plane and for indexing wafers into engagement with the wafer transfer arm, means for extending and retracting the wafer transfer arm to and between the cassette holder and the input station, and means associated with the input station for removing a wafer from the wafer transfer arm. The wafer transfer arm includes elongated primary and secondary sections coupled together for rotation about a pivot axis, the primary section having a primary axis of rotation spaced apart and parallel to the pivot axis. The secondary section has a wafer support pick at the opposite end from the pivot axis. The transfer arm further includes linkage means for causing the secondary section to rotate about the pivot axis at a predetermined rate greater than the primary section rotates about the primary axis.

It is preferred that the distance between the primary axis and the pivot axis be equal to the distance between the pivot axis and the nominal wafer center of the wafer pick and that the linkage means cause the secondary section to rotate about the pivot axis at twice the rate of rotation of the primary section so that the wafer is moved by the wafer transfer arm in a straight line. It is further preferred that wafer transfer arm be movable for access to a plurality of cassette holders.

According to another aspect of the present invention, there is provided apparatus for transferring a wafer to an input station comprising a wafer location station at a predetermined distance from the input station including means for sensing an actual wafer location relative to a desired wafer location and determining a correction based on the difference between the actual wafer location and the desired location, and means for transferring the wafer from the wafer location station to the input station, the transfer means including means for translating the wafer at the input station by the required correction so that the wafer is positioned at the desired location at the input station. It is preferred that the wafer location sensing means include means for rotating the wafer and means for sensing the wafer edge position as the wafer is rotated. According to another aspect of the invention, the wafer location station further includes means for sensing the angular orientation of the wafer and for correcting the angular orientation to a desired orientation. It is preferred that the wafer be transferred from the wafer location station to the input station by a wafer transfer arm and that the correction in the direction of arm movement be made by extending the arm more or less than the nominal extension. It is further preferred that the correction perpendicular to arm movement be made by translating the wafer transfer arm by the required correction.

According to yet another aspect of the present invention, there is provided apparatus for transferring a semiconductor wafer from a first station to a second station comprising a wafer transfer arm for transferring a wafer to and between the first station and the second station, the transfer arm including a generally horizontal wafer support pick near the end thereof, means for extending and retracting the transfer arm to and between the first station and the second station, means for sensing the presence or absence of a wafer on the support pick by sensing the weight of the wafer thereon, and means for responding to the presence or absence of a wafer on the support pick in a desired manner. It is preferred that the wafer be sensed by a strain gauge mounted on the wafer transfer arm.

According to still another aspect of the present invention, there is provided a method for transferring a semiconductor wafer from a cassette holder to an input station of a processing system. The method comprises the steps of transferring the wafer from the cassette holder to a wafer location station, sensing an actual wafer location relative to a desired wafer location, determining a correction based on the difference between the actual wafer location and the desired wafer location, transferring the wafer from the location station to the input station, and translating the wafer during the step of transferring the wafer to the input station by the required correction so that the wafer is positioned at the desired location at the input station. In a preferred embodiment, the method further includes the step of sensing the angular orientation of the wafer by determining the location of a wafer flat and rotating the wafer to a desired angular orientation at the wafer location station.

BRIEF DESCRIPTION OF THE DRAWINGS

For a better understanding of the present invention together with other and further objects, advantages and capabilities thereof, reference may be had to the accompanying drawings in which.

DETAILED DESCRIPTION OF THE INVENTION

Figure 1:
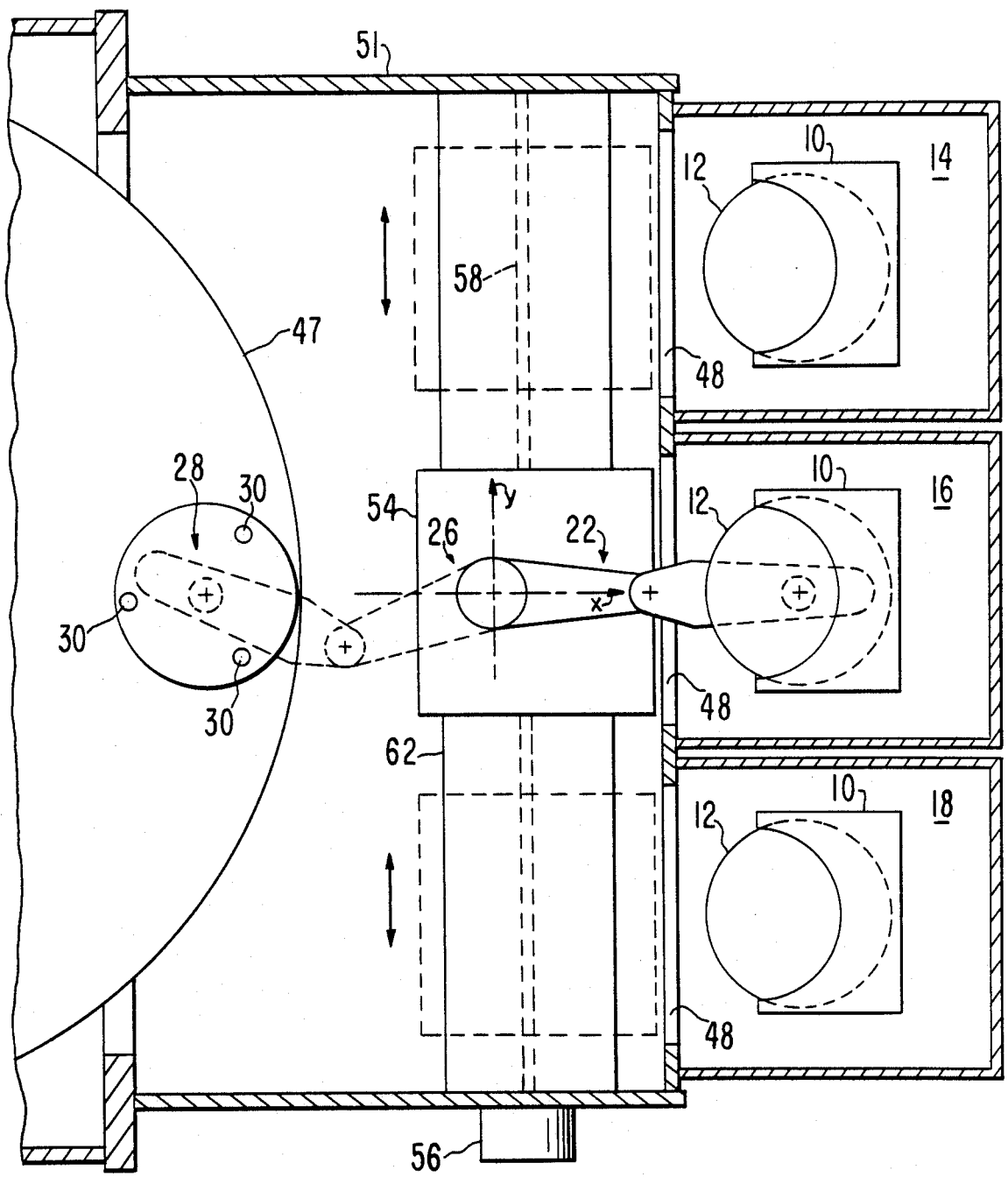
FIG. 1 is a plan view of a wafer transfer apparatus is accordance with the present invention.
Figure 2:
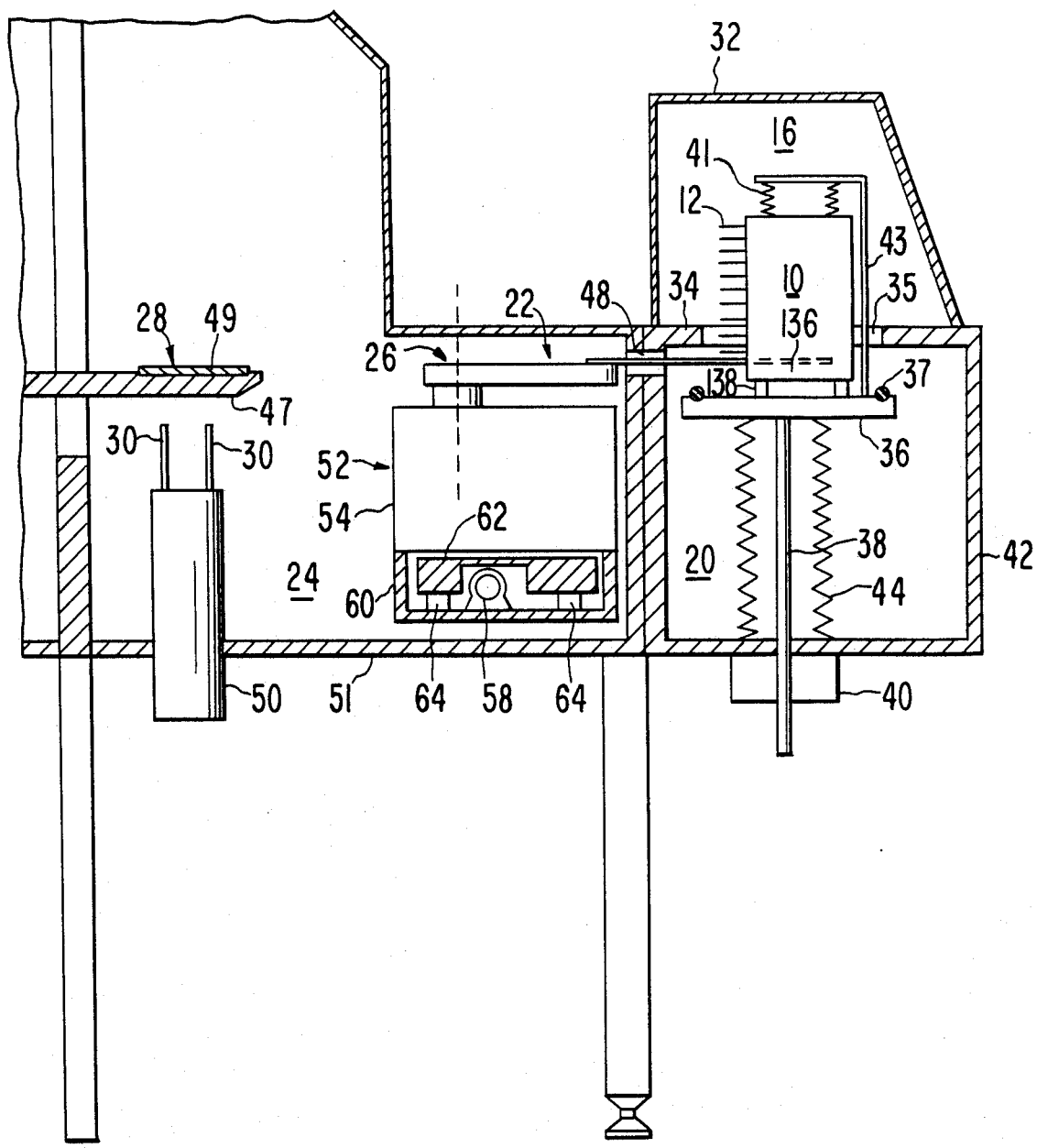
FIG. 2 is a cross-sectional elevation of the wafer transfer apparatus shown in FIG. 1.

Wafer transfer apparatus in accordance with the present invention is illustrated in FIGS. 1 and 2. Briefly, the apparatus operates as follows. Cassette holders 10 each holding a plurality of wafers 12 are placed in cassette locks 14, 16, 18. The cassette locks 14, 16, 18 are evacuated and the cassette holders 10 are lowered into an evacuated elevator chamber 20. Wafers are removed from the cassette holder 10 one at a time by a wafer transfer arm 22, are moved into a transfer vacuum chamber 24 to a location and orientation station 26 where the wafer position on the arm 22 is sensed. The angular orientation of the wafer can be changed, if necessary. The arm 22 is then extended along an x-axis, and the wafer is transferred to an input station 28 of a processing system. In placing the wafer at the input station 28, position errors sensed at the station 26 are eliminated by compensating displacements. At the input station 28 there is provided means comprising lift pins 30 for removing the wafer from the transfer arm 22. After processing, the transfer arm 22 returns the wafer to the cassette holder 10 without use of the location and orientation station 26. When wafers are transferred from either of the outer cassette locks 14, 18, the transfer arm 22 is translated laterally along a y-axis for access to the respective cassette lock. The wafer is removed from the cassette, the transfer arm is returned to the center position and the arm is extended to the input station 28. The construction and operation of the wafer transfer system in accordance with the present invention is described in detail hereinafter.

Each of the cassette locks 14, 16, 18 is enclosed by a cover 32 which can be raised and lowered for insertion and removal of cassette holders 10 and a bottom plate 34. The cassette locks 14, 16, 18 are connected to a vacuum pumping system (not shown) for evacuation thereof. The locks 14, 16, 18 are individually sealed and connected to vacuum pumping systems so that cassette holders 10 may be exchanged in one of the locks while the other locks are under vacuum. The bottom plate 34 includes an opening 35 sealed by a cassette support plate 36. The support plate 36 is sealed with an 0-ring 37 to the plate 34 during exchange of cassettes and is lowered by a cassette elevator system for transfer of wafers by the system. A sealed bellows 41 is positioned between the top of each cassette holder 10 and an L-shaped bracket 43 mounted to the support plate 36 and extending over the cassette holder 10. The bellows 41 is collapsed by atmospheric pressure when the lock is open, but contains sufficient gas to expand when the lock is vacuum pumped. In the expanded condition the bellows 41 holds the cassette holder 10 down firmly against the chocks 138 and tends to eliminate warping of the cassette holder 10.

An elevator shaft 38 connected to the bottom of support plate 36 passes through the elevator chamber 20 to an elevator drive 40 which is preferably a d.c. servo motor. The elevator chamber 20 is defined by a housing 42 which includes the bottom plate 34 and the support plate 36 as a common wall with the cassette locks 14, 16, 18. The elevator chamber 20 is connected to a vacuum pumping system (not shown) for evacuation thereof. The elevator shaft 38 is sealed from the interior of the elevator chamber 20 by a bellows 44. The elevator drive 40 is positioned outside the elevator chamber 20 provides the capability to move the cassette holder 10 up and down in desired increments and to seal the cassette support plate 36 against the bottom plate 34 for exchange of cassette holders. The elevator chamber includes an opening 48 into the transfer vacuum chamber 24 for access by the transfer arm 22. The opening 48 is preferably provided with a valve (not shown) for isolation of the elevator chamber 20 to permit servicing.

In the present example, the input station 28 is a disk 47 for mounting a plurality of wafers in a batch-type ion implantation system. Wafers are mounted near the periphery of the disk, one at a time, by the wafer transfer apparatus of the present invention. During wafer loading and unloading, the disk is incrementally rotated so that each wafer mounting location on the disk is presented to the wafer transfer system. It will be understood that the wafer transfer apparatus of the present invention can transfer wafers to an input station in any type of processing or treatment system.

The lift pins 30, typically three in number, are moved upwardly and downwardly by an actuating air cylinder 50 through holes in a wafer support platen 49 on the disk 47. The pins 30 lift a wafer from the platen 49 surface for removal by the arm 22, or lift a wafer from the transfer arm 22 for placement on the platen 49 surface. As described hereinafter, the transfer arm 22 includes a relatively thin, flat wafer pick which passes between the wafer and the platen 49. When a wafer is being loaded onto the disk 47, the pins 30 lift the wafer from the transfer arm 22 which is then retracted. When a wafer is being removed from the disk, it is lifted by the pins 30, the transfer arm 22 is extended between the wafer and the platen 49, and the lift pins 30 are lowered, thereby lowering the wafer onto the transfer arm 22. Usually, the wafer is clamped to the platen 49 surface at the input station 28. Alternatively, the wafer can be moved from the input station to another location within the processing system.

Figure 4:
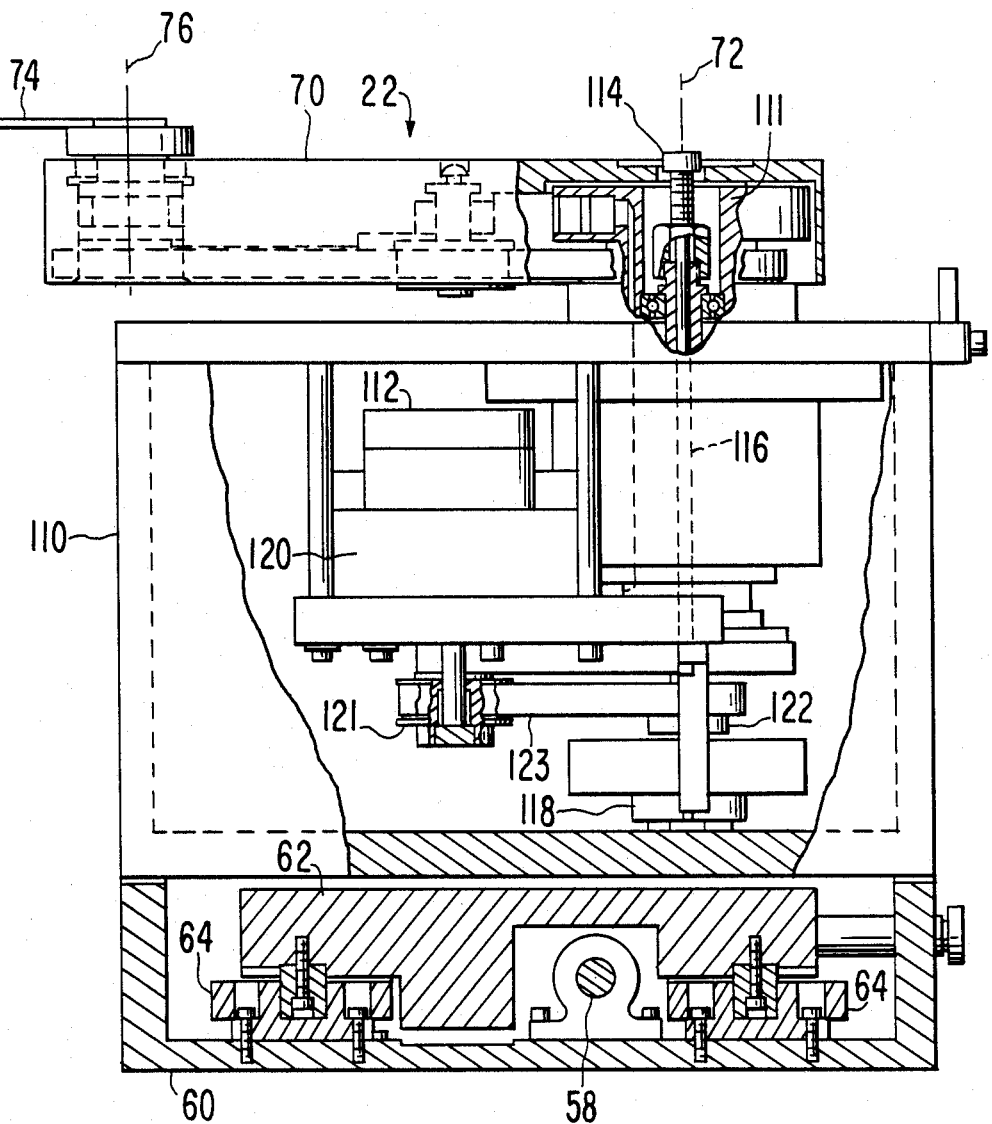
FIG. 4 is an elevation, partly in cross-section, of the wafer transfer arm and drive.
Figure 5:
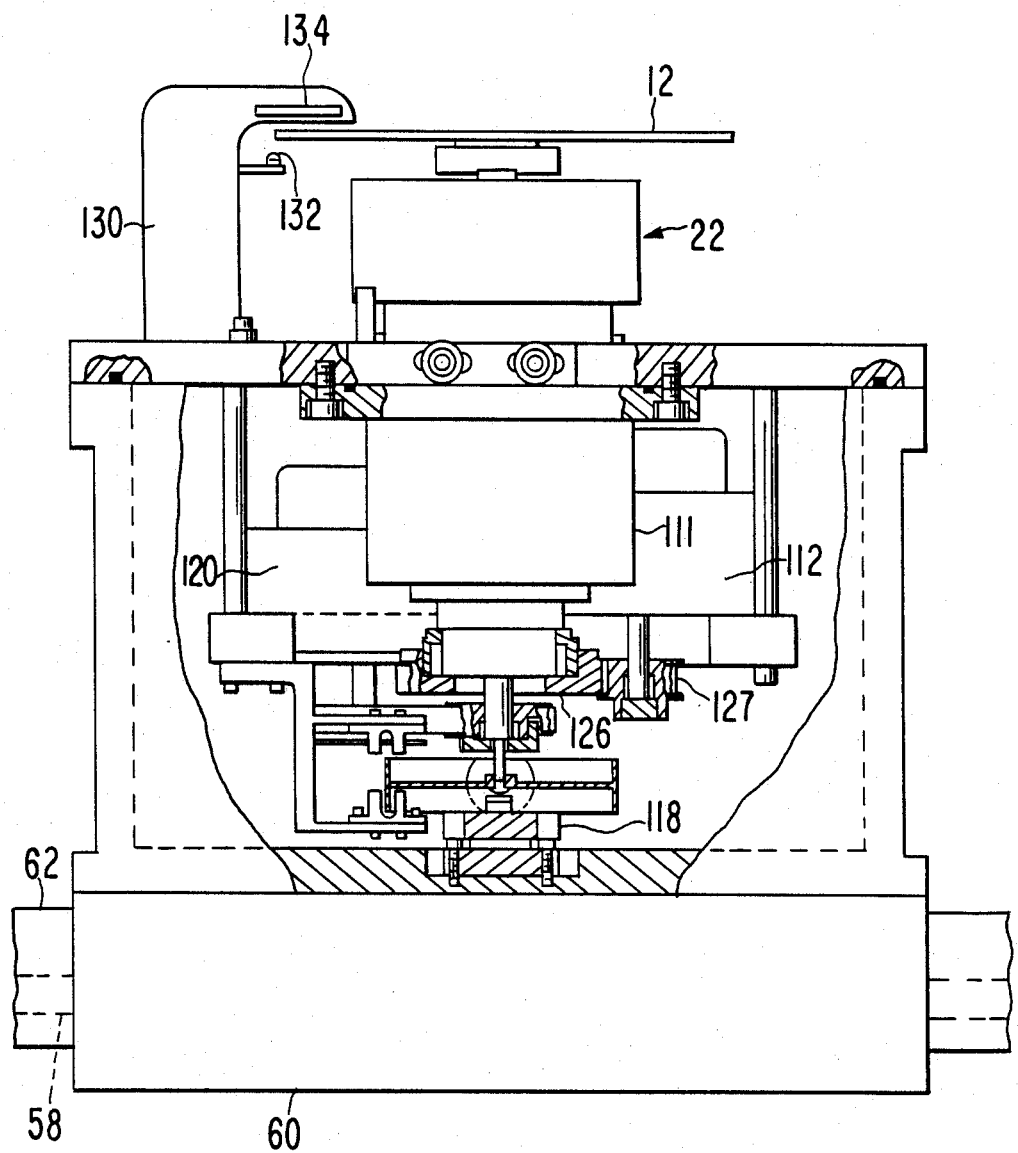
FIG. 5 is a second elevation, partly in cross-section, of the wafer transfer arm and drive.

The transfer vacuum chamber 24 is defined by a housing 51 and is connected to a vacuum pumping system (not shown) for evacuation thereof. The transfer arm 22 is located in the chamber 24 and is supported and operated by a transfer drive system 52. The drive system 52 includes a drive assembly 54 which supports and drives the transfer arm 22. The drive assembly 54 and the arm 22 are laterally movable along the y-axis shown in FIG. 1. The drive assembly 54 is movable along the y-axis under control of a drive motor 56 positioned outside the chamber 24 and a lead screw 58. As shown in FIGS. 4 and 5, the drive assembly 54 is mounted to a U-shaped support bracket 60. A guide track 62 is mounted across the chamber 24 parallel to the y-axis in front of the cassette locks 14, 16, 18. The support bracket 60 is coupled to the guide track 62 by linear rails 64. The lead screw 58 is attached to the support bracket 60 and, when operated by the motor 56, drives the combination of the support bracket 60 and the drive assembly 54 along the linear rails 64.

Figure 3:
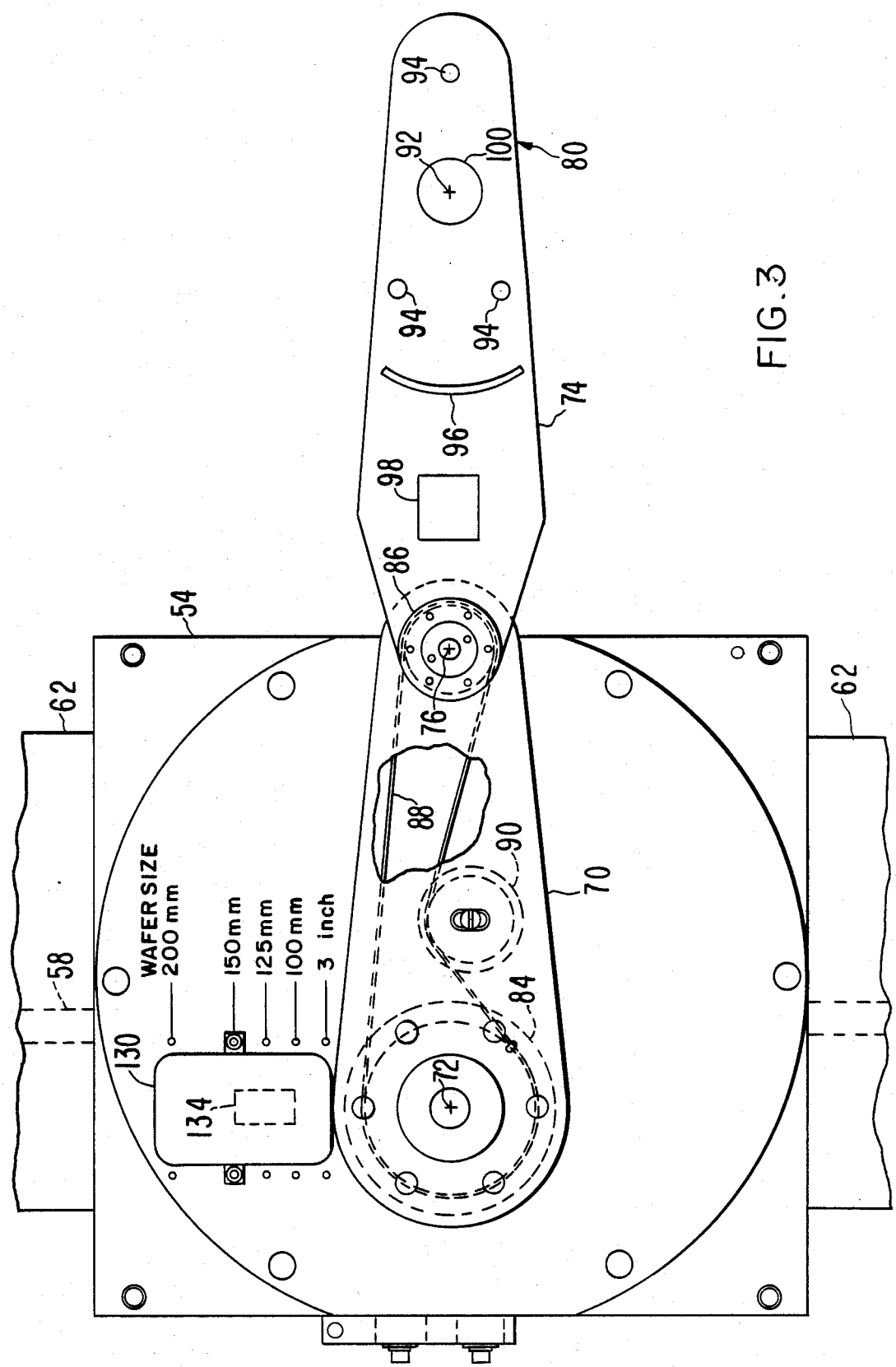
FIG. 3 is a plan view of the wafer transfer arm and drive of the present invention.

Referring now to FIG. 3, the wafer transfer arm 22 includes an elongated primary section 70 connected at a primary axis 72 to the drive assembly 54 for rotation about the primary axis 72. An elongated secondary section 74 is connected to the primary section 70 for rotation about a pivot axis 76. Near the end of the secondary section 74, opposite the pivot axis 76, there is provided a wafer support pick 80. A primary pulley 84 is mounted on the primary axis 72 in a fixed position on the drive assembly 54. A secondary pulley 86 is fixed to the secondary section 74 on the pivot axis 76. A drive belt 88 connects the primary pulley 84 and the secondary pulley 88. A belt tensioner 90 provides means for adjusting tension in the drive belt 88. The primary pulley 84 is preferably twice the diameter of the secondary pulley 86. With this ratio of diameters, as the primary section 70 is rotated about the primary axis 72, the secondary section 74 is caused to rotate about the pivot axis 76 at twice the angular rate of the primary section 70. That is, for each revolution of the primary section 70, the secondary section 74 makes two revolutions. This arrangement provides linear motion of a nominal wafer center 92 on the wafer pick 80 when the distance between the primary axis 72 and the pivot axis 76 is equal to the distance between the pivot axis 76 and the nominal wafer center 92.

The wafer pick 80 at the remote end of the secondary section 74 is typically a thin, flat metal sheet .050-inch thick, or less, to permit access between wafers in the cassette holder 10. The nominal wafer center 92 ideally should be aligned with the center of the wafer during transfer. The upper surface of the wafer pick 80 is provided with several pads 94 of polyurethane or other material having a high coefficient of friction, in the area contacted by the wafer. The pads 94 enhance friction between the wafer and the pick 80 and prevent the wafer from inadvertently sliding off the pick. The pick 80 is further provided with a raised stop 96 which has a crescent shape to match the wafer periphery and is located at the periphery of the nominal wafer position.

The stop 96 assists in properly positioning a wafer on the pick 80 when the wafer is being removed from the cassette holder 10. A strain gauge 98, such as a type piezoresistive strain gauge, is preferably mounted on the upper surface of the secondary section 74, preferably close to the pivot axis 76 to sense the presence of a wafer on the pick 80. Strain gauge 98, as is known in the art, provides an electrical signal dependent on the strain in the secondary section 74 produced by the weight of a wafer thereon. To enhance the sensing, the secondary section 74 is preferably a thin, flat member throughout its length. The wafer pick 80 is further provided with a hole 100 concentric with the nominal wafer center 92 for operation of the wafer orientor as described hereinafter.

Figure 6:
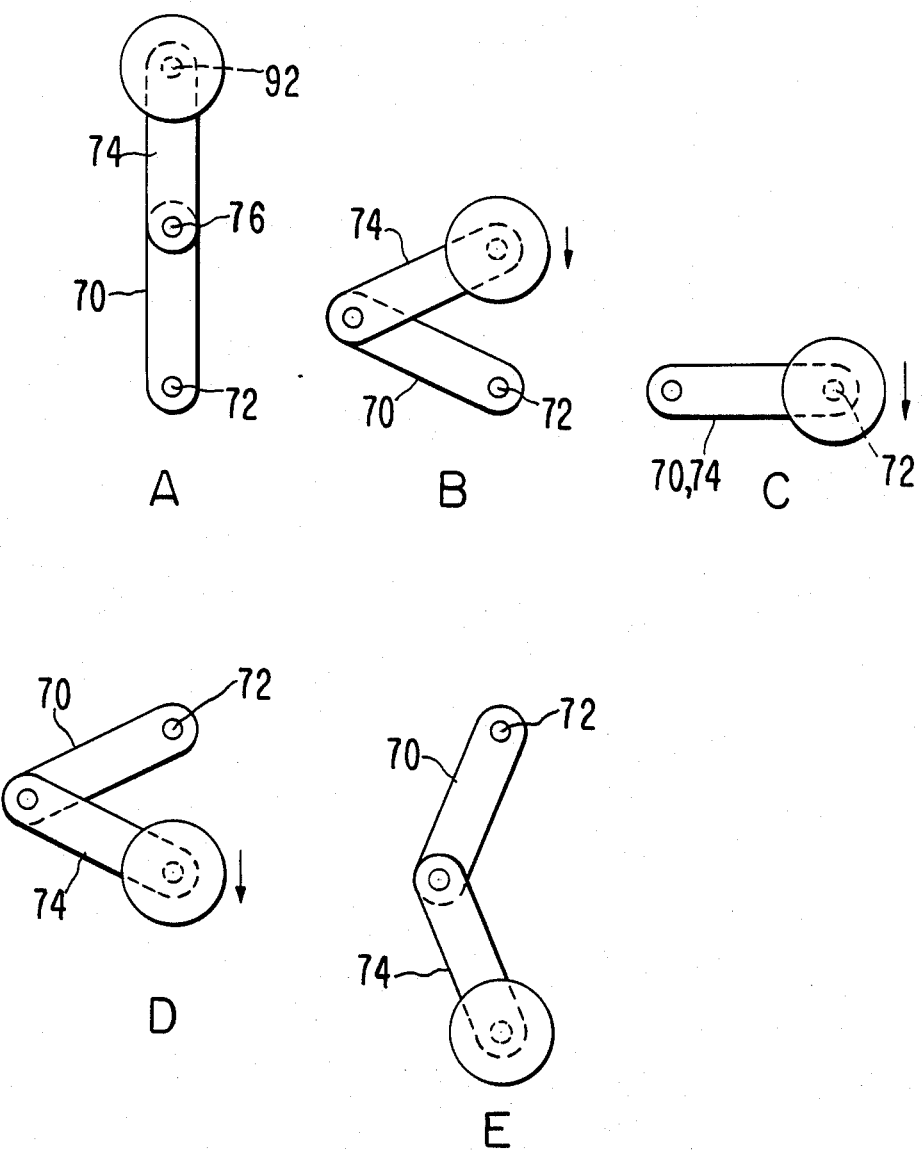
FIG. 6 diagrammatically illustrates the movement of the wafer transfer arm.

The motion of the wafer transfer arm 22 is illustrated in FIGS. 6A–6E. As described above, the arrangement of the pulleys 84, 86 and the drive belt 88 rotates the secondary section 74 at twice the angular rate of the primary section 70. In addition, the distance between the primary axis 72 and the pivot axis 76 is made equal to the distance between the pivot axis 76 and the nominal wafer center 92. With these dimensions, the wafer is moved by the transfer arm 22 in a straight line as indicated in FIGS. 6A–6E. With reference to FIG. 6C, it is noted that when the primary section 70 overlaps the secondary section 74, the nominal wafer center 92 and hole 100 are aligned with the primary axis 72. This is important in operation of the wafer orientor as described hereinafter. With reference to FIG. 6E, it is noted that the arm 22 is not fully extended when the wafer reaches the input station 28. This is important in operation of the wafer orientor as described hereinafter, since additional travel is available to compensate for inadvertent displacement of the wafer relative to its desired position. FIG. 6A shows the arm 22 fully extended for removal of a wafer from the cassette holder 10. FIG. 6C shows the arm 22 in its neutral, or orient, position. FIG. 6E shows the arm 22 nearly fully extended for placement of the wafer at the input station 28. FIGS. 6B and 6D show intermediate positions of the transfer arm 22. An alternative wafer transfer arm construction is shown and described in a copending application entitled "Wafer Handling Arm" of Richard Weinberg filed concurrently herewith.

The wafer transfer arm 22 shown and described herein is advantageous in reliable transfer of wafers since the arm drive motor is ramped to maintain the acceleration of the wafer at well below one "g" and to start movement with low velocity. Thus, sudden starting and stopping and high acceleration of the arm, which could cause wafers to be dropped, are avoided.

Referring now to FIGS. 4 and 5, there are shown the details of the transfer arm drive assembly 54 with the transfer arm 22 mounted thereto for rotation about the primary axis 72. The drive motors and associated hardware for the transfer arm 22 are located within a sealed drive housing 110, the interior of which is maintained at atmosphere. The drive housing 110 is connected via a flexible hose (not shown) through the vacuum chamber 24 to the external environment to maintain atmospheric pressure in its interior. As a result, the drive motors and hardware are adequately cooled by conduction cooling and particulates generated by moving parts are contained within the drive housing 110. A drive shaft 111 for the transfer arm 22 passes through a fluid seal to the interior of the housing 110 and is coupled to an arm drive motor 112 by a pulley 126 on the drive shaft 111, a pulley 127 on the motor 112 and an interconnecting belt (not shown). The drive motor 112 is preferably a d.c. servo motor for highly accurate control of position of the transfer arm 22.

An orientor chuck 114, having a generally flat upper surface provided with a polyurethane ring for friction with a wafer, is located in the upper surface of the primary section 70 on the primary axis 72. The orientor chuck 114 is supported by a chuck shaft 116 on the primary axis 72 which passes through and is concentric with the drive shaft 111 into the drive housing 110. The chuck shaft 116 can be raised and lowered by an air cylinder 118. When the transfer arm is in the neutral position as shown in FIG. 6C, the orientor chuck 114 is lifted through the hole 100 in the secondary section 74 and lifts the wafer above the wafer pick 80. The chuck shaft 116 is also connected to an orientor motor 120 by pulleys 121, 122 and drive belt 123. The orientor motor 120 can be a d.c. servo motor. When the orientor chuck 114 is raised by the air cylinder 118 to lift the wafer as described above, the motor 120 is energized to rotate the orientor chuck 114 and the wafer for wafer position sensing as described hereinafter.

Figure 7:
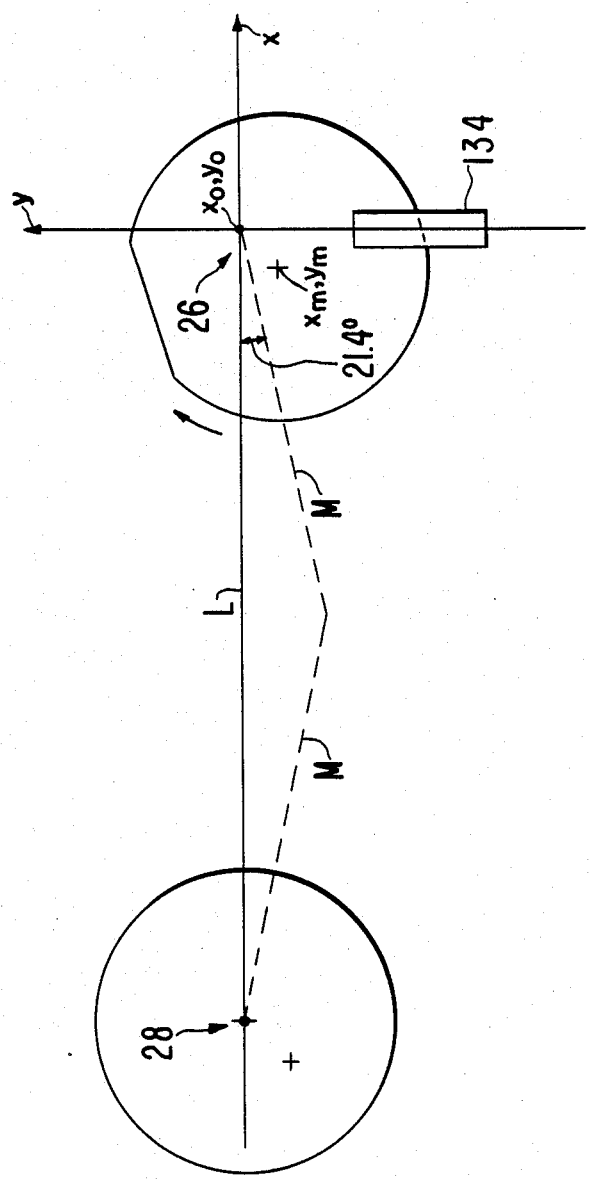
FIG. 7 diagrammatically illustrates the operation of the wafer position correction and orientation system.

A wafer location and orientation sensor as shown in FIG. 5 includes a support bracket 130 for a light source 132 and a solar cell 134. The light source 132 is positioned near the edge of the wafer and is directed across the wafer edge to the solar cell 134. The solar cell is mounted with its long dimension aligned with the primary axis 72 and facing the wafer and the light source 132. The wafer blocks a portion of the light from the source 132 from reaching the solar cell 134. As the wafer is rotated about the primary axis 72, the solar cell output is monitored. If the wafer is perfectly centered on the primary axis 72, the output of the solar cell 134 remains constant except at the wafer flat. The signal variation at the flat can be used to determine the angular orientation of the wafer flat and to correct the flat to a desired angular orientation by rotation of the orientor chuck 114. In the usual case where the wafer is not perfectly centered on the primary axis 72, the solar cell 134 output varies as the wafer is rotated. The output signal variation is processed to determine the actual wafer center relative to the desired wafer center $x_o$, $y_o$ on the primary axis 72, as shown in FIG. 7.

As shown in FIG. 1, the y axis of the wafer transfer apparatus is defined by the path followed by the primary axis 72 as it is translated for access to the cassette holders and locks 14, 16 and 18. The x axis is defined by a line drawn through the center of the input station 28 and the nominal center of wafers in cassette lock 16. Primary axis 72 is located at the origin of the above-defined coordinate system when transferring wafers to and from the input station 28 and when transferring wafers to and from the middle cassette lock 16.

In the orientor of the present invention, the correction to the position of the wafer is made by the placement of the wafer at the input station 28 at a corrected position. The x axis error is compensated by a correction to the extension of the transfer arm 22. That is, the arm 22 is extended more or less than the normal extension to eliminate x-axis error. The y axis error is compensated by movement of the entire transfer arm 22 and drive assembly 54 along the guide track 62 by the amount of the y-axis error. Thus, for example, if the displacement error is determined by the solar cell 134 and associated processing circuitry to be $x_m = -0.1$ inch and $y_m = -0.2$ inch, then the wafer is placed at the input station 28 as follows. The x axis error is compensated by placing the wafer at the input station 28 with the transfer arm 22 extended by 0.1-inch less than its nominal position. The transfer arm 22 and the drive assembly 54 are translated by the motor 56 and the lead screw 58 in the positive y direction by 0.2-inch to compensate for the original y axis error and by the newly induced y axis error due to the x correction. The wafer is then lowered to the input station 28 by the pins 30 exactly centered with respect to the input station 28.

As noted above, the rotational orientation of the wafer is determined at the location and orientation station 26 and is corrected by rotation of the orientor chuck 114. It can be seen that the wafer undergoes rotation as it is moved from the location and orientation station 26 to the input station 28 by the transfer arm 22. This rotation is calculated and is compensated by a corresponding opposite rotation of the orientor chuck 114 so that the wafer is positioned with the desired orientation at the input station 28.

The signal from the solar cell 134 as a function of wafer rotation angle is converted to digital form with an analog to digital converter and supplied to a computer where the data is reduced by a convolver such as a 3×1 convolver. To locate major and minor flats and notches, peaks and valleys in the convolved data with absolute value greater than a predetermined threshold are identified. The zero crossing from peak to valley in the convolved data determines the angle of the wafer flat.

The data from the flat must be deleted when determining the actual position of the wafer center relative to a reference point, or desired position. Then, for a number of the stored raw data points from the solar cell, compute the difference mean with the corresponding data point 180 degrees away to give $x_i$. Then, for each $x_i$, compute the difference mean of the two data points which are 90 degrees away from the first points to give $y_i$. This generates N pairs of $(x_i, y_i)$. Designate the first pair as the coordinate system and compute relative to the coordinate system:

$$\begin{bmatrix} x_m \\ y_m \end{bmatrix} = \begin{bmatrix} x_o \\ y_o \end{bmatrix} + \frac{1}{N} \sum_{i=1}^{N} \begin{bmatrix} \cos \phi_i & \sin \phi_i \\ -\sin \phi_i & \cos \phi_i \end{bmatrix} \begin{bmatrix} x_i \\ y_i \end{bmatrix}$$

where $(x_o, y_o)$ is the center of rotation, $(x_m, y_m)$ is the actual center of the wafer relative to the center of rotation and $\phi_i$ is the angle between the coordinate system and $(x_i, y_i)$. Then find $$\phi = \tan^{-1}(y_m/x_m)$$

$$R_e = \text{Sqrt}(X_m^2 + Y_m^2)$$

where $\phi$ is the angle to the actual wafer center and $R_e$ is the distance to the actual wafer center.

Next, consider wafer angular orientation. Let $\alpha$ be the desired angle of the wafer flat at the input station 28. As the arm 22 transfers the wafer from the station 26 to the input station 28, the wafer is rotated through an angle equal to the angle between the arm 22 and the x axis when the arm 22 is extended to the input station 28, as shown in FIG. 1. In the present example, this angle is 21.4°. At the station 26, rotate the midpoint of the wafer flat such that it is at $\alpha - 21.4°$. Since the wafer center is displaced from the center of rotation, the wafer center is rotated by $\beta = (\alpha - 21.4°) - \theta$, where $\theta =$ initial angle of the wafer flat, to $(x_d, y_d)$ $$\begin{bmatrix} x_d \\ y_d \end{bmatrix} = \begin{bmatrix} \cos \beta & \sin \beta \\ -\sin \beta & \cos \beta \end{bmatrix} \begin{bmatrix} x_m \\ y_m \end{bmatrix}$$

Now, transferring the wafer to the input station 28 will rotate $(x_d, y_d)$ to $(x_d', y_d')$ $$\begin{bmatrix} x_d' \\ y_d' \end{bmatrix} = \begin{bmatrix} \cos 21.4° & \sin 21.4° \\ -\sin 21.4° & \cos 21.4° \end{bmatrix} \begin{bmatrix} x_d \\ y_d \end{bmatrix}$$

Since the wafer flat will be rotated by $(21.4° - d\theta)$ extra from the desired channeling angle where $$d\theta = \cos^{-1}(L + x_d')/(2M),$$

where L is the total linear displacement and M is the length of the primary arm. Then initially rotate the midpoint of the wafer flat at the station 26 by $(\beta - (21.4° - d\theta))$. Then rotate the arm 22 by $d\theta$ to perfectly align and position the wafer at the input station 28.

The wafer positioning and orientation system described herein can be used to present a wafer to a wafer identification visual inspection station, such as a character reader, for enhanced process control.

Figure 8:
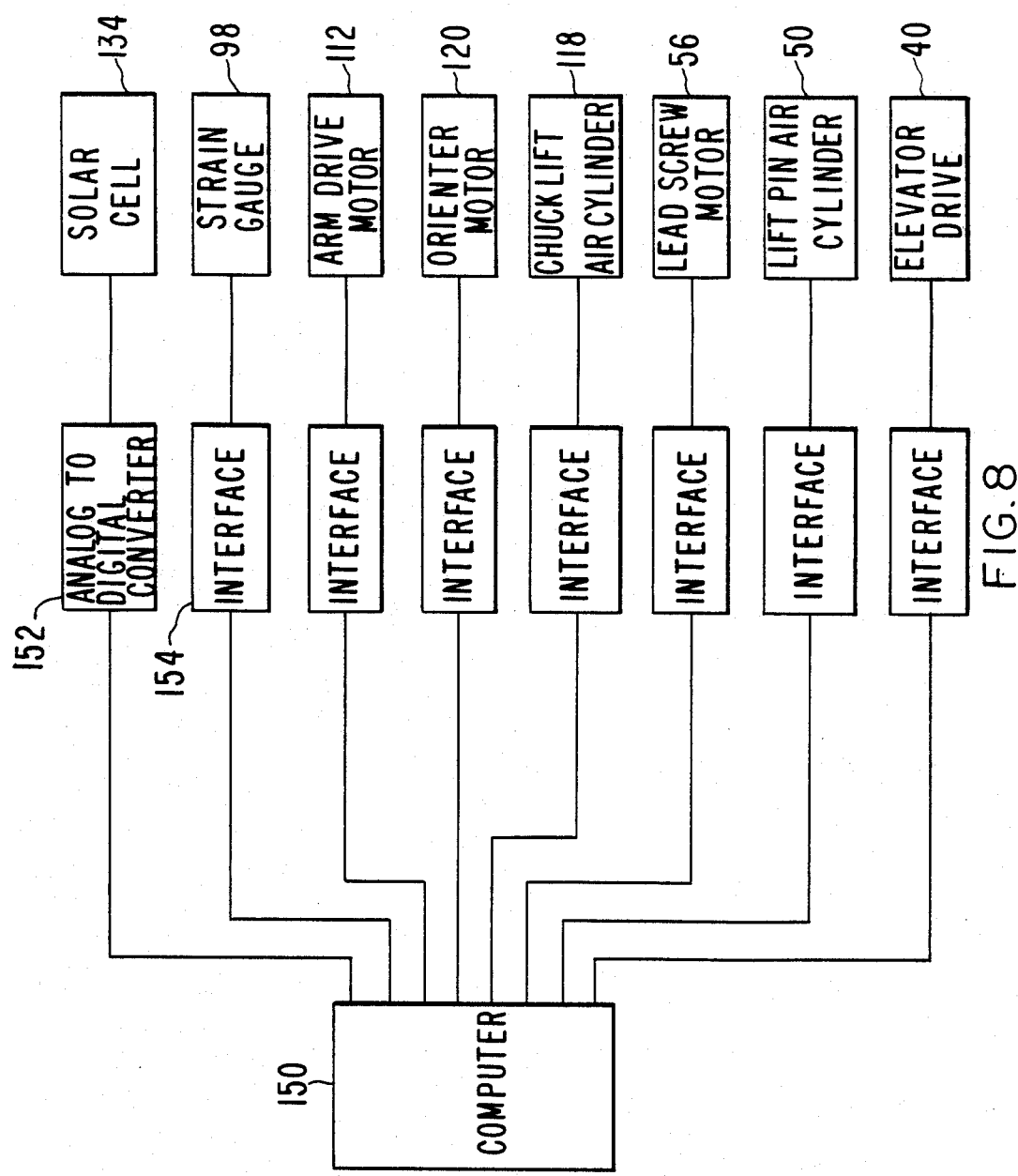
FIG. 8 is a block diagram of the control system of the present invention.

A simplified block diagram of the control system of the present invention is shown in FIG. 8. A computer 150 with appropriate memory and peripheral devices receives and processes signals from the solar cell 134 through an analog to digital converter 152 as described above. The computer 150 also receives signals from the strain gauge 98 through an interface circuit 154. Energizing signals for arm drive motor 112, orientor motor 120, chuck lift air cylinder 118, lead screw motor 56, lift pin air cylinder 50 and elevator drive 40 are supplied by the computer through suitable interface circuits. Encoders are used to feed position signals from the servo motors back to the computer for high accuracy positioning.

In operation, an operator places cassette holders 10 containing wafers in one or more of the cassette locks 14, 16, 18. The covers 32 of the cassette locks 14, 16, 18 are closed, and the cassette locks are vacuum pumped to a pressure level approaching that of the elevator chamber 20. The elevator drive is energized to lower the cassette support plate 36 and cassette holder 10 to a predetermined position relative to the transfer arm 22. The cassette support plate 36 is preferably provided with chocks 138 which raise the level of the cassette holder 10 and provide access by the wafer pick 80 to a space 136 between the lowermost wafer in the cassette holder 10 and the upper surface of the support plate 36 since the end of the cassette holder 10 is partially open. The space 136 is centered on the plane of the transfer arm 22 and the transfer arm 22 is extended into the space 136. Next, the cassette holder 10 is moved downwardly by means of the elevator drive 40 until the first wafer makes contact with the wafer pick 80 as determined by the signal from the strain gauge 98. The cassette elevator is stopped with the first wafer resting on the pick 80. The physical contact between the first wafer and the wafer pick 80 is used by the system computer to calculate the position of the remaining wafers in the cassette holder 10, based on the known spacing between slots in the cassette holder. The strain gauge 98 provides the ability to locate wafers in the cassette holder 10, based on actual position of the first wafer and the spacing of cassette slots, plus any tolerances in the cassette. However, tolerances of the system elements are not involved in the location of the wafers.

The wafer pick 80, with the first wafer from the cassette holder 10 resting thereon, is moved by operation of the transfer arm 22 to the location and orientation station 26. The orientor chuck 114 is raised by operation of the air cylinder 118 so as to raise the wafer above the wafer pick 80. The wafer is then rotated by operation of the orientor motor 120 through at least one complete revolution. During rotation the light source 132 and the solar cell 134 sense the position of the wafer relative to the primary axis 72 and determine correction $x_m$, $y_m$, as described hereinabove. In addition the solar cell 134 and associated circuitry determine the orientation of the wafer flat. Then, the orientor chuck 114 is again rotated until the wafer flat is at the desired orientation with compensation for subsequent rotation by the arm 22. Then, the arm 22 is extended to the input station 28 with the necessary position corrections $x_m$, $y_m$ made as described hereinabove.

When wafers are being removed from either of the outer cassette locks 14, 18, the transfer arm 22 and the drive assembly 54 are moved along the guide track 62 by the motor 56 and lead screw 58 to a position in front of the respective cassette lock. The wafer is withdrawn from the cassette holder, as described above, and moved to the location and orientation station 26. Then, the transfer arm 22 and the drive assembly 54 are moved back to the center location on the x axis. The location and orientation sensing are performed and the wafer is transferred to the input station 28 as described above. When the wafer reaches the input station in the corrected position, the pins 30 are raised by the air cylinder 50 to lift the wafer from the wafer pick 80. The transfer arm 22 is withdrawn from beneath the wafer, and the wafer is lowered by the pins 30 onto the wafer support platen or other wafer support means at the input station 28. The loading process can be repeated until a number of wafers are loaded to successive stations on, for example, the rotating disk of an ion implanter. In wafer removal from the input station 28, the process described above is reversed except that the location and orientation procedure is not required. The wafer is moved directly from the input station 28 to the cassette holder with appropriate translation along the y axis, if necessary.

It will be understood that the wafer transfer apparatus of the present invention can be programmed so that a number of wafers can successively be loaded to the input station 28 and later successively removed from the input station 28. If desired, the load and unload procedure can be alternated so that one wafer is removed from the input station and a new wafer is loaded before the disk is rotated to a new position. Furthermore, the system has the capability of loading and unloading wafers from cassettes in a programmable fashion. That is, the wafer pick 80 can remove a wafer from a predetermined slot of a predetermined cassette and can replace a wafer in a predetermined slot of a predetermined cassette, provided the slot is empty.

The use of the strain gauge 98 for wafer sensing has been described above in connection with locating wafers in the cassette holder 10. The strain gauge 98 is also useful in determining whether a wafer is broken or inadvertently falls from the wafer pick 80 at any time during the transfer process. When a wafer is broken, a portion usually falls away, thereby reducing the weight on the wafer pick and causing a change in the signal output by the strain gauge 98. Thus, the strain gauge 98 is useful in detecting the presence or absence of wafers. When a wafer is dropped or broken, it is necessary for the system to alert the operator so that corrective action can be taken.

The wafer transfer apparatus of the present invention has been shown and described hereinabove in connection with linearly aligned cassette locks 14, 16, 18, necessitating translation of the transfer arm 22 and the drive assembly 54 along the y axis for access to each cassette lock. In an alternative embodiment, the cassette locks and associated cassette holders are positioned on two or three sides of the transfer arm 22 and facing toward the primary axis 72. The transfer arm 22 and drive assembly 54 in this embodiment are mounted for rotation, rather than linear translation, to access each of the cassette locks. In this embodiment, the transfer arm is rotatable for extension and retraction. In addition, the entire drive assembly 54 is rotated about the primary axis 72 so that the transfer arm 22 can be extended in another direction; for example, along the y axis. Furthermore, while the transfer apparatus of the present invention is particularly useful for semiconductor wafer transfer, it will be understood that any thin disk-shaped workpiece can be handled by the system.

It will be understood that the wafer position correction system described herein can be utilized without the angular orientation function when wafer flat orientation is not required. In addition, the wafer transfer apparatus described above operates in vacuum. However, the system can be operated in atmosphere when the requirements of the system so dictate.

While there has been shown and described what is at present considered the preferred embodiments of the present invention, it will be obvious to those skilled in the art that various changes and modifications may be made therein without departing from the scope of the invention as defined by the appended claims.

What is claimed is:

1. Apparatus for transferring a wafer from a cassette holder to an input station of a processing system, comprising:

a single wafer transfer arm for removing a waver from the cassette holder and for transferring the waver between the cassette holder and the input station, said waver transfer arm including elongated primary and secondary section coupled together for rotation about a pivot axis, said primary section having a primary axis of rotation spaced apart from and parallel to said pivot axis, said secondary section having a wafer support pick at the opposite end from said pivot axis, said transfer arm further including linkage means for causing said secondary section to rotate about the pivot axis at a predetermined rate greater than said primary section rotates about the primary axis;

an intermediate station for sensing undesired displacement of said wafer relative to said wafer pick;

means for holding the cassette holder and for indexing said wafer into engagement with said wafer pick; and means for extending and retracting said waver transfer arm to and between the cassette holder, the intermediate station and the input station, including means for causing said wafer transfer arm to transfer said waver from said cassette holder to said intermediate station for sensing undesired displacement of said wafer relative to said wafer pick and means for causing said waver transfer arm to place said wafer in said input station in a corrected position which compensates for said undesired displacement by a correction factor equal in magnitude and opposite in direction to said undesired displacement, said correction factor being introduced as said wafer is moved by said wafer transfer arm from said intermediate station to said input station.

2. Wafer transfer apparatus as defined in claim 1 further including means for moving said wafer transfer arm and said means for extending and retracting said wafer transfer arm, for access to a plurality of cassette holders.

3. Wafer transfer apparatus as defined in claim 2 wherein the distance between said primary axis and said pivot axis is equal to the distance between said pivot axis and a nominal wafer center of said wafer pick, and wherein said linkage means causes said secondary section to rotate about said pivot axis at twice the rate at which said primary section rotates about said primary axis, whereby said wafer transfer arm moves a wafer in a straight line.

4. Wafer transfer apparatus as defined in claim 3 wherein said linkage means includes a primary pulley in a fixed position on the primary axis, a secondary pulley coupled to the secondary section on the pivot axis and a belt drive coupled between the primary pulley and the secondary pulley.

5. Wafer transfer apparatus as defined in claim 1 wherein said intermediate station includes means for rotating said wafer and noncontact means for sensing the edge position of said wafer during rotation and means for converting edge information to a displacement relative to a reference point.

6. Wafer transfer apparatus as defined in claim 1 wherein said means for causing said wafer transfer arm to place the wafer in a corrected position includes means for correcting the travel of said wafer transfer arm and means for translating said wafer transfer arm laterally so as to obtain said correction factor.

7. Wafer transfer apparatus as defined in claim 1 wherein said intermediate station is located on said primary axis and further including orientation sensing means on said primary axis comprising an orientation chuck, means for lifting said chuck above said wafer pick, means for rotating said orientation chuck and said wafer, and means for sensing the edge position of said wafer as the wafer is rotated.

8. Wafer transfer apparatus as defined in claim 7 wherein said orientation chuck is lifted on said primary axis through a hole through said wafer pick.

9. Apparatus for transferring a wafer to an input station comprising:

a wafer location station at a predetermined distance from said input station, including means for determining an actual wafer center location in x and y directions relative to a desired wafer center location at a point $x_o$, $y_o$ and determining a correction based on the difference between the actual wafer center location and the desired wafer center location; and means for transferring said wafer from said wafer location station to said input station, said transfer means including means for translating said wafer by said correction as it is transferred from said wafer is positioned at the desired location at said input station.

10. Wafer transfer apparatus as defined in claim 9 wherein said transfer means includes a robot-like transfer arm having a wafer pick movable between said wafer location station and said input station.

11. Wafer transfer apparatus as defined in claim 10 wherein said wafer location sensing means includes means for rotating said wafer and means for sensing the wafer edge position as said wafer is rotated.

12. Wafer transfer apparatus as defined in claim 11 wherein said wafer edge sensing means includes a light source and a light sensor positioned on opposite sides of said wafer edge.

13. Wafer transfer apparatus as defined in claim 10 wherein the correction in one of said x and y directions is obtained by varying the extension of said wafer transfer arm from the normal extension thereof.

14. Wafer transfer apparatus as defined in claim 13 wherein said transfer means further includes means for translating said wafer transfer arm laterally with respect to the axis between said wafer location station and said input station and the correction in the other of said x and y directions is obtained by lateral translation of said wafer transfer arm.

15. Wafer transfer apparatus as defined in claim 9 wherein said wafer location station further includes means for sensing the angular orientation of said wafer and correcting said angular orientation to a desired orientation.

16. Wafer transfer apparatus as defined in claim 15 wherein said means for correcting said angular orientation includes means for rotating said wafer at said wafer location station.

17. Wafer transfer apparatus as defined in claim 9 wherein said transfer means includes a wafer transfer arm for transferring a wafer between the wafer location station and the input station, said wafer transfer arm including elongated primary and secondary sections coupled together for rotation about a pivot axis, said primary section having a primary axis of rotation spaced apart and parallel to said pivot axis, said secondary section having a wafer support pick at the opposite end from said pivot axis, said transfer arm further including linkage means for causing said secondary section to rotate about the pivot axis at a predetermined rate greater than said primary section rotates about the primary axis.

18. Wafer transfer apparatus as defined in claim 17 wherein said wafer location sensing means is located on said primary axis and comprises an orientation chuck, means for lifting said chuck above said wafer pick and means for rotating said orientation chuck and said wafer and means for sensing the position of the wafer edge as the wafer is rotated.

19. Apparatus for transferring a semiconductor wafer form a cassette holder to an input station of a processing system comprising;

a wafer location station intermediate said cassette holder and said input station at a predetermined distance from said input station including means for sensing an actual wafer location relative to a desired wafer location and for determining a correction based on the difference between the actual wafer location and the desired wafer location; and means for transferring said wafer from said cassette holder to said wafer location station for wafer location sensing and for transferring said wafer from said wafer location station to said input station, said transfer means including means for translating said wafer by said correction as it is transferring from said wafer location station to said input station so that said wafer is positioned at the desired location at said input station.

20. Wafer transfer apparatus as defined in claim 19 wherein said transfer means includes a robot-like transfer arm having a wafer pick movable between said wafer location station and said input station.

21. Wafer transfer apparatus as defined in claim 20 wherein said wafer location sensing means includes means for rotating said wafer and means for sensing the wafer edge position as said wafer is rotated.

22. Wafer transfer apparatus as defined in claim 21 wherein said wafer edge sensing means includes a light source and a light sensor positioned on opposite sides of said wafer edge.

23. Wafer transfer apparatus as defined in claim 20 wherein the correction in one direction is obtained by varying the extension of said wafer transfer arm from the normal extension thereof.

24. Wafer transfer apparatus as defined in claim 23 wherein said transfer means further includes means for translating said wafer transfer arm laterally with respect to the axis between said wafer location station and said input station and the correction normal to the direction of arm extension is obtained by lateral translation of said wafer transfer arm.

25. Wafer transfer apparatus as defined in claim 19 wherein said wafer location station further includes means for sensing the angular orientation of said wafer and correcting said angular orientation to a desired orientation.

26. Wafer transfer apparatus as defined in claim 25 wherein said means for correcting said angular orientation includes means for rotating said wafer at said wafer location station.

27. Wafer transfer apparatus as defined in claim 19 wherein said transfer means includes a wafer transfer arm for transferring a wafer between the wafer location station and the input station, said wafer transfer arm including elongated primary and secondary sections coupled together for rotation about a pivot axis, said primary section having a primary axis of rotation spaced apart and parallel to said pivot axis, said secondary section having a wafer support pick at the opposite end from said pivot axis, said transfer arm further including linkage means for causing said secondary section to rotate about the pivot axis at a predetermined rate greater than said primary section rotates about the primary axis.

28. Wafer transfer apparatus as defined in claim 27 wherein said wafer location sensing means is located on said primary axis and comprises an orientation chuck, means for lifting said chuck above said wafer pick and means for rotating said orientation chuck and said wafer and means for sensing the position of the wafer edge as the wafer is rotated.

29. Wafer transfer apparatus as defined in claim 28 wherein said input station is an end station disk of an ion implantation system.

30. Wafer transfer apparatus as defined in claim 28 wherein said cassette holder, said wafer location station and said transfer means are located in an evacuated chamber communicating with a vacuum treatment chamber for said wafer.

31. Apparatus for transferring a wafer from a cassette holder to an input station of a processing system, comprising:

a single wafer transfer arm for removing a wafer form the cassette holder and for transferring the wafer between the cassette holder and the input station, said wafer transfer arm including elongated primary and secondary sections coupled together for rotation about a pivot axis, said primary section having a primary axis of rotation spaced apart form and parallel to said pivot axis, said secondary section having a wafer support pick at the opposite end from said pivot axis, said transfer arm further including linkage means for a causing said secondary section to rotate about the pivot axis at a predetermined rate greater than said primary section rotates about the primary axis;

means for holding the cassette holder and for indexing said wafer into engagement with said wafer pick, said cassette holder being held in a vaccuum lock and said holding means including a sealed bellows mounted to expand when the vacuum lock is evacuated and to hold said cassette holder firmly in place; and means for extending and retracting said wafer transfer arm to and between the cassette holder and the input station.

32. A method for transferring a semiconductor wafer from a cassette holder to an input station of a processing system comprising the steps of:

transferring the wafer from the cassette holder to a wafer location station;

sensing an actual wafer location relative to a desired wafer location;

determining a correction based on the difference between the actual wafer location and the desired wafer location;

transferring said wafer from said wafer location station to said input station; and translating said wafer during the step of transferring the wafer to the input station by said correction so that said wafer is positioned at the desired location at said input station.

33. A method for transferring a semiconductor wafer as defined in claim 32 wherein the step of sensing the actual wafer location includes the steps of rotating the wafer about the desired wafer location and sensing the position of the wafer edge during the step of rotation.

34. A method for transferring a semiconductor wafer as defined in claim 33 further including the step of sensing the angular orientation of said wafer by determining the location of a wafer flat and rotating the wafer to a desired angular orientation at said wafer location station.

35. A method for transferring a semiconductor wafer as defined in claim 34 wherein the step of determining the correction includes the steps of determining the actual angular orientation of the wafer flat by convolving the wafer edge data and identifying zero crossings in the convolved data, and determining the position of the actual wafer center relative to the center of rotation by calculating the difference mean between wafer edge data 180 degrees apart for at least two sets of points not in the wafer flat.

36. A method for transferring a semiconductor wafer as defined in claim 35 further including the step of rotating the wafer from the actual angular orientation to a desired angular orientation at said wafer location station.

37. A method for transferring a semiconductor wafer as defined in claim 36 wherein the step of rotating the wafer to a desired angular orietantion includes the step of compensating for rotation occurring during the step of transferring the wafer to said input station so that the wafer is accurately placed at the input station.

38. Apparatus for transferring a wafer from a cassette holder to an input station of a vacuum processing system, comprising:
    means for transferring the wafer to and between the cassette holder and the input station;
    a vacuum lock containing said cassette holder; and
    means for holding the cassette holder and for indexing said wafer into engagement with said transfer means, said holding means including a sealed bellows mounted to expand when the vacuum lock is evacuated and to retain said cassette holder firmly in place in said vacuum lock.

* * * * *

UNITED STATES PATENT AND TRADEMARK OFFICE
CERTIFICATE OF CORRECTION

PATENT NO. : 4,836,733
DATED : 06-06-89
INVENTOR(S) : HERTEL et al.

It is certified that error appears in the above-identified patent and that said Letters Patent is hereby corrected as shown below:

In column 5, line 38, delete "is".
In column 9, line 51, replace the comma following the closing parenthesis by a period.
In claim 1, line 4,6,7,27 and 30, replace "waver" by —wafer—.
In claim 1, line 8, replace "section" by —sections—.
In claim 9, at the end of line 14 after "said" insert —wafer location station to said input station so that said—

Signed and Sealed this

Fourth Day of September, 1990

Attest:

HARRY F. MANBECK, JR.

*Attesting Officer*  *Commissioner of Patents and Trademarks*